United States Patent
Marinella et al.

(10) Patent No.: US 10,489,483 B1
(45) Date of Patent: Nov. 26, 2019

(54) CIRCUIT ARRANGEMENT AND TECHNIQUE FOR SETTING MATRIX VALUES IN THREE-TERMINAL MEMORY CELLS

(71) Applicant: National Technology & Engineering Solutions of Sandia, LLC, Albuquerque, NM (US)

(72) Inventors: Matthew Marinella, Gilbert, AZ (US); Sapan Agarwal, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/137,758

(22) Filed: Sep. 21, 2018

(51) Int. Cl.
| | |
|---|---|
| *G11C 11/34* | (2006.01) |
| *G06F 17/16* | (2006.01) |
| *G11C 16/04* | (2006.01) |
| *G06N 3/04* | (2006.01) |
| *H01L 29/792* | (2006.01) |

(52) U.S. Cl.
CPC .......... *G06F 17/16* (2013.01); *G11C 16/0408* (2013.01); *G11C 16/0466* (2013.01); *G06N 3/04* (2013.01); *H01L 29/792* (2013.01)

(58) Field of Classification Search
CPC .. G06F 17/16; G06F 16/0408; G06F 16/0466; G06N 3/04; H01L 29/792
USPC .................................................... 365/185.18
See application file for complete search history.

(56) References Cited

U.S. PATENT DOCUMENTS

| | | | | | |
|---|---|---|---|---|---|
| 5,155,377 | A | * | 10/1992 | Castro ................... | G06N 3/0635 706/33 |
| 5,247,206 | A | * | 9/1993 | Castro .................... | G06N 3/063 706/35 |
| 5,256,911 | A | * | 10/1993 | Holler ................... | G06N 3/0635 706/37 |
| 5,444,821 | A | * | 8/1995 | Li ........................ | G06N 3/0635 706/33 |

(Continued)

OTHER PUBLICATIONS

Marinella, M. J. et al., "Multiscale Co-Design Analysis of Energy, Latency, Area, and Accuracy of a ReRAM Analog Neural Training Accelerator," IEEE Journal on Emerging and Selected Topics in Circuits and Systems (2018) 8 (1):86-101.

(Continued)

*Primary Examiner* — Viet Q Nguyen
(74) *Attorney, Agent, or Firm* — Martin I. Finston

(57) ABSTRACT

A method for programming substantially simultaneously more than one of the three-terminal memory cells that represent the values of a matrix to be multiplied by a vector is disclosed. Programming may be achieved by controlling the gate-drain voltage for more than one cell simultaneously to change each such cell's physical state and hence its effective resistance. Illustratively, the gates of each row of the cells corresponding to the matrix are coupled together and each coupled row is coupled to a respective controllable voltage source while the drains of each column of the cells of the matrix are coupled together and each coupled column is coupled to a respective controllable voltage source. The controllable voltage sources are arranged so that at the intersection of a row and a column, a cell experiences one of three conditions: increase effective resistance, decrease effective resistance, or substantially no change.

20 Claims, 3 Drawing Sheets

(56) References Cited

U.S. PATENT DOCUMENTS

| | | | | |
|---|---|---|---|---|
| 6,032,140 | A * | 2/2000 | Fabbrizio | G06N 3/0635 706/15 |
| 6,397,201 | B1 * | 5/2002 | Arathorn | G06N 3/0635 706/33 |
| 6,580,296 | B1 * | 6/2003 | Beiu | H03K 19/0813 326/112 |
| 8,001,065 | B2 * | 8/2011 | Tanaka | G06N 3/063 706/15 |
| 9,760,533 | B2 * | 9/2017 | Fick | G06F 17/11 |
| 9,825,132 | B2 * | 11/2017 | Sedighi | H01L 29/78648 |
| 9,852,132 | B2 * | 12/2017 | Chhichhia | G06F 16/93 |
| 10,043,855 | B1 * | 8/2018 | Agarwal | H01L 27/3276 |
| 10,055,383 | B1 * | 8/2018 | Shafiee Ardestani | G06F 17/16 |
| 10,255,551 | B2 * | 4/2019 | Fick | G06N 3/08 |
| 10,374,041 | B2 * | 8/2019 | Li | H01L 29/0646 |
| 10,381,074 | B1 * | 8/2019 | Kim | G06F 17/16 |
| 2013/0088245 | A1 * | 4/2013 | Sezginer | G03F 1/84 324/679 |
| 2014/0078811 | A1 * | 3/2014 | Kawai | G11C 13/00 365/148 |
| 2017/0041620 | A1 * | 2/2017 | Du | H04N 19/132 |
| 2017/0228345 | A1 * | 8/2017 | Gupta | G06F 17/141 |
| 2017/0316827 | A1 * | 11/2017 | Ge | G11C 7/1006 |
| 2018/0067720 | A1 * | 3/2018 | Bekas | G06F 7/483 |
| 2018/0321942 | A1 * | 11/2018 | Yu | G11C 5/02 |
| 2019/0065151 | A1 * | 2/2019 | Chen | G06F 7/5443 |
| 2019/0205729 | A1 * | 7/2019 | Tran | G06F 17/16 |
| 2019/0205741 | A1 * | 7/2019 | Gupta | G06F 9/3853 |
| 2019/0236111 | A1 * | 8/2019 | Muralimanohar | G06F 17/16 |
| 2019/0237137 | A1 * | 8/2019 | Buchanan | G06F 17/16 |

OTHER PUBLICATIONS

Ramakrisnan, S. et al., "Vector-Matrix Multiply and Winner-Take-All as an Analog Classifier," IEEE Transactions on Very Large Scale Integration (VLSI) Systems, 2014, pp. 353-361, vol. 22.

Guo, X. et al., "Fast, energy-efficient, robust, and reproducible mixed-signal neuromorphic classifier based on embedded NOR flash memory technology," 2017, IEEE International Electron Devices Meeting (IEDM), San Francisco, CA, pp. 6.5.1-6.5.4.

Guo, X. et al., "Temperature-insensitive analog vector-by-matrix multiplier based on 55 nm NOR flash memory cells," 2017 IEEE Custom Integrated Circuits Conference (CICC), Austin, TX, pp. 1-4.

\* cited by examiner

CIRCUIT ARRANGEMENT AND TECHNIQUE FOR SETTING MATRIX VALUES IN THREE-TERMINAL MEMORY CELLS

GOVERNMENT RIGHTS IN THE INVENTION

This invention was made with Government support under Contract No. DE-NA0003525 awarded by the United States Department of Energy/National Nuclear Security Administration. The U.S. Government has certain rights in the invention.

TECHNICAL FIELD

This invention relates to vector matrix multiplication using three-terminal memory cells, and more particularly, to a circuit and technique for setting the values of the matrix in the memory cells.

BACKGROUND OF THE INVENTION

It is well known that multiplying a vector by a matrix (vector matrix multiplication) can be performed using three-terminal memory cells, which may be floating gate cells or other cells with suitable properties, to represent the values stored in the matrix. Electric charge is pulsed individually into such three-terminal memory cells, which may be arranged in geometrical correspondence to the matrix elements, to set an "effective channel resistance" of each cell that represents the corresponding matrix value.

The effective resistance may be considered to be, more strictly speaking, the amount of current allowed to flow in the three-terminal memory cell from source to drain for a particular gate voltage. Changing the amount of charge in the three-terminal memory cell changes the threshold voltage for allowing current flow between the source drain; hence for a given gate voltage, the amount of current that will flow from source to drain is altered when the amount of charge is altered. In some current-voltage regimes, this relationship can be approximated in terms of a resistance, hence the term "effective resistance" is adopted here.

When charge is pulsed into a three-terminal memory cell, the memory cell undergoes some physical change. For example, charge may be trapped in the device, ions may move in the device, or atoms within the device may become rearranged. For convenience herein, this will be referred to as the physical state of the device. The cells employed may be known suitable types such as silicon-oxide-nitride-oxide-silicon (SONOS), floating polygate transistors, EEPROM, NAND flash bit cells, NOR flash bit cells, or the like. Although not required, such elements will often have a floating-gate metal oxide semiconductor (MOS) transistor. When MOS transistors are employed in the cells, the transistors may be arranged to have a floating gate that is electrically isolated from ground, thus allowing it to store and retain charge. As will be readily recognized, the amount of charge depends on the voltage level and duration of the pulses used to program the cell.

The channel current between the source and drain of each cell for a given read-operation gate voltage is determined by the physical state of the device, i.e., it is a function thereof. For floating gate transistors, the physical state is determined by how much charge is floating in its gate. Therefore, each cell may be individually programmed by supplying voltage pulses to it until the stored charge, and the resulting current, corresponds to the value the cell is supposed to represent.

Other three-terminal devices, such as ferroelectric FETs, that also use a stored state to modify the channel conductance may also be used. Similarly, three-terminal programmable resistors may also be used. Changing the channel current by changing the physical state is equivalent to changing the effective channel resistance. For convenience herein, generally all types of such three-terminal devices that are suitable to be employed for such vector matrix multiplication will be referred to as three-terminal memory cells. Also for convenience herein, it should be understood that for devices that are not floating gate cells, adding charge or removing charge should be defined as changing the physical state by supplying charge to the gate or removing charge from the gate.

Each element of a vector that is to be multiplied by the matrix is represented by a voltage that is applied to the source terminals of all of the cells along a corresponding row of the matrix. The resulting currents from the drains are integrated along the columns so as to produce a summed current. The current may be applied to an analog-to-digital converter (ADC) to produce a digital representation of the value represented by the total of each column current.

SUMMARY OF THE INVENTION

We have recognized that it is time-consuming to individually program the matrix values into the cells. This problem is mitigated, in accordance with the principles of the invention, by the substantially simultaneous programming of more than one of the three-terminal memory cells representing respective matrix elements. This may be achieved by controlling the gate-drain voltage (VGD) for more than one cell at a time, such that charge is added or removed from the gate.

More specifically, the gates of each row of the cells corresponding to the matrix are coupled together and each coupled row is coupled to a respective controllable voltage source, while the drains of each column of the cells of the matrix are coupled together and each coupled column is coupled to a respective controllable voltage source. The controllable voltage sources are arranged so that each cell at the intersection of a row and a column experiences one of the following three conditions:

Increase effective resistance, which is achieved for floating gate cells by adding charge thereto; Decrease effective resistance, which is achieved for floating gate cells by removing charge therefrom; or Substantially no change, which is achieved for floating gate cells by neither adding charge thereto nor removing charge therefrom, so that the charge remains unchanged.

In one embodiment of the invention, the above conditions may be achieved by satisfying certain criteria defined in terms of the gate-to-drain voltage VGD and the absolute value of its magnitude, i.e., IVGDI. Specifically, the increase resistance condition may be achieved by providing negative VGD with IVGDI greater than a first threshold, e.g., a first write threshold; the decrease resistance condition may be achieved by providing positive VGD with IVGDI greater than a second threshold, e.g., a second write threshold; and the substantially no change condition is achieved by any negative VGD with IVGDI less than the first threshold and by any positive VGD with IVGDI less than the second threshold. The first and second thresholds are typically dependent on the device used in the cells; in the event they are equal to each other, they are simply referred to as the "write threshold".

The charge used to change the physical state of a cell may be supplied through the use of pulses which are supplied on the coupled gates and drains. Advantageously, multiple cells may be charged a certain amount in parallel and then selected individual cells may be further charged or have charge removed until their desired values are obtained. Likewise, multiple cells may have a certain amount of charge removed in parallel and then selected individual cells may have further charge removed or added until their desired values are obtained.

Higher voltages typically supply charge more quickly for pulses of the same duration. The voltages supplied may be under the control of a control unit to set the values of the cells to the required values.

In order to program different values to different cells, the lengths of the pulses and voltage values applied to each row or column can be varied.

Thus, the value of at least two of the cells as represented by its resistance (or equivalently, its conductance) is changed substantially simultaneously, wherein the change of resistance is a function of the supplied charge.

Advantageously, the time to program the entire array is reduced, thus speeding up the overall process for performing the vector matrix multiplication with new values for the matrix elements. The matrix elements, which for some purposes may be considered to be weights in a neural network application, makes the inventive technique especially advantageous in neural network training.

DETAILED DESCRIPTION

Figure 1:
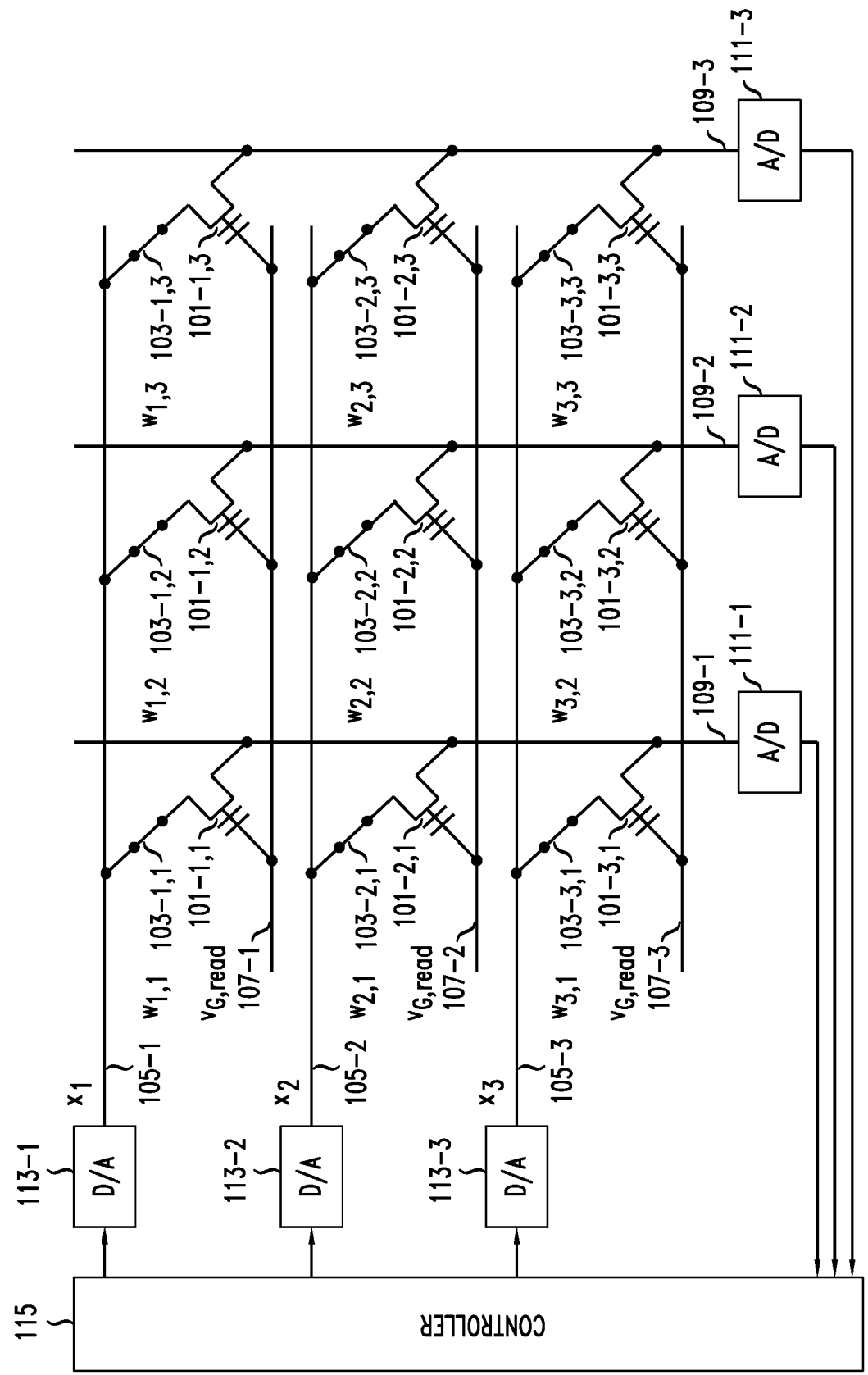
FIG. 1 shows an illustrative 3×3 array of three-terminal memory cells arranged to be used to represent elements of a matrix or array of 9 values which are to be multiplied by a row vector.

The following merely illustrates the principles of the invention. It will thus be appreciated that those skilled in the art will be able to devise various arrangements that, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry or components embodying the principles of the invention.

The functions of the various elements shown in the FIGS., including any functional blocks labeled as "processors" or "controllers", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. A processor may have one or more so-called "processing cores". Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), graphics processing unit (GPU), read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function. This may include, for example, a) a combination of electrical or mechanical elements which performs that function or b) software in any form, including, therefore, firmware, microcode or the like, combined with appropriate circuitry for executing that software to perform the function, as well as mechanical elements coupled to software controlled circuitry, if any. The invention as defined by such claims resides in the fact that the functionalities provided by the various recited means are combined and brought together in the manner which the claims call for. Applicant thus regards any means which can provide those functionalities as equivalent as those shown herein.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the drawings are not drawn to scale.

In the description, identically numbered components within different ones of the FIGS. refer to the same components.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving", "selecting", "assigning", "estimating", "determining", or the like, refer to the action and processes of a computer system, or similar computing device, that manipulates and transforms data represented as physical (electronic) quantities within the computer system's registers and memories into other data similarly represented as physical quantities within the computer system memories or registers or other such information storage, transmission, or display devices.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

FIG. 1 shows an illustrative 3×3 array of three-terminal memory cells 101, including cells 101-1,1 through 101-3,3, which may be referred to individually or collectively as cells 101, arranged to be used to represent elements of a matrix or array W of 9 values arranged as:

$W_{1,1}$ $W_{1,2}$ $W_{1,3}$
$W_{2,1}$ $W_{2,1}$ $W_{2,3}$
$W_{3,1}$ $W_{3,2}$ $W_{3,3}$

The elements of matrix W are to be multiplied by a vector X having elements $X_1$, $X_2$, $X_3$, that are represented as respective voltage pulses on input lines 105-1 through 105-3, collectively input lines 105. The elements of matrix W are represented by the conductance (or equivalently, resistance) of the cells 101 which are determined by their physical state.

In some embodiments, such as those based on floating gate cells, gate charging lines 107-1 through 107-3, collectively gate charging lines 107, are set to a fixed read voltage $V_{g,read}$. The read voltage can be set to any value that is below a write threshold of cells 101, such a write threshold being discussed in more detail hereinbelow. The read voltage may be supplied by D/A converters 201 shown and described hereinbelow in connection with FIG. 2. Alternatively, it may be supplied from another voltage source as it is typically a single voltage that may set at the time of manufacture when cells 101 are incorporated into an integrated circuit. This voltage may be controllably supplied using a switching mechanism (not shown).

It may be advantageous to set the read voltage near the read threshold voltage of cells 101. This allows for small changes in the physical state to result in large changes in the effective resistance. The read threshold is the gate voltage at which a floating gate transistor turns on. The effective resistance of cells 101 is determined with respect to the read voltage on gate charging lines 107.

In other embodiments, cells 101 may be implemented as programmable resistors. In this case, the channel effective resistance and current will be independent of the gate voltage and so gate charging lines 107 can be set to any voltage below the write threshold or left disconnected.

The voltage pulses on input lines 105 may be of fixed duration and different voltage level (i.e., pulse height) in some embodiments, and they may be of fixed voltage level and of different durations in other embodiments. In yet further embodiments, both the voltage level and the pulse duration may vary. The voltage pulses supplied to input lines 105 are set by digital to analog (D/A) converters 113-1 through 113-3, collectively D/A converters 113. Each of D/A converters 113 is in turn coupled to controller 115 for receiving therefrom digital values to be converted into corresponding analog voltages.

The voltage pulses pass through switches 103-1,1 through 103-3,3, collectively switches 103, and pass to the drain terminals of cells 101. Note that, when the three-terminal memory cell is symmetric, as is typically the case, the terminal of a cell that is coupled to a column is referred to herein for purpose of convenience as the drain and the opposite terminal is referred to as the source. Although switches 103 are shown using conventional mechanical switch representation, this is merely for clarity of exposition. In actual practice, switches 103 may be transistors and they may all be controlled together, e.g., by a common control signal.

Alternatively, a diode that acts like a switch, in that it is off until the voltage across it is over a certain voltage, may be employed. In such a case when reading, which requires the switches to be closed, it is necessary to be sure that the voltage across the diode is above the threshold, whereas to write, which requires the switches to be open, as described hereinbelow, it is necessary to be sure that the voltage across the diode is below the threshold.

Switches 103 are desirable primarily for reliability and low power during writing for commonly available three-terminal memory cells. Hence in other embodiments employing other three-terminal memory cells, switches 103 may be removed and replaced simply by a wire which would be equivalent to leaving switches 103 closed at all times.

To program the array in parallel, charge is pulsed into the gate of each of cells 101 using respective ones of gate charging lines 107. The method for achieving this will be described in more detail hereinbelow. Each cell 101, which in the embodiment of FIG. 1 is a form of field effect transistor (FET), acts as a programmable conductance element in which the conductance of each cell is determined by how much charge has been supplied to, and has thereby been stored in, its floating gate. As those skilled in the art will readily understand, somewhat different configurations may be employed in embodiments which employ a three-terminal device other than an FET to serve as the programmable conductance.

To perform a vector matrix multiplication when the physical state has been programmed, values representing vector X are supplied in the form of voltage pulses on the respective vector element lines 105-1 through 105-3, collectively referred to herein as vector element lines 105. These voltages are set by D/A converters 113 as indicated hereinabove. Thus, e.g., a voltage pulse representing $X_1$ is applied to vector element line 105-1, a voltage pulse representing $X_2$ is applied to vector element line 105-2, and a voltage pulse representing $X_3$ is applied to vector element line 105-3.

In accordance with Ohm's law I=GV, where the effective conductance G expresses the current:voltage ratio, a voltage is applied to the source terminal and a current is supplied from the drain terminal of each of cells 101. The current produced by each cell 101 is determined by the product of two quantities: The value of the particular element of vector X that is applied to the cell's source, and the value of the particular element of matrix W that the cell represents, in accordance with the physical state that was impressed on it by the charge stored therein.

The source terminals of the cells in each column are connected together such that the source currents from column are summed together and output to one of output lines 109-1 through 109-3, collectively output lines 109. As a result, the current on output line 109-1 represents $X_1W_{1,1}+X_2W_{2,1}+X_3W_{3,1}$, the current on output line 109-2 represents $X_1W_{1,2}+X_2W_{2,2}+X_3W_{3,2}$, and the current on output line 109-3 represents $X_1W_{1,3}+X_2W_{2,3}+X_3W_{3,3}$. These resulting values may then be digitized using, e.g., A/D converters 111-1 through 111-3 (collectively, "A/D converters 111"), each of which converts the produced current supplied to it to a corresponding digital representation, which then may be used in further processing and/or stored. For example, the outputs of A/D converters 111 may be supplied to controller 115 for further processing and/or storage.

Note that our example using a 3×3 matrix and a three-element vector is not meant to be limiting; other dimensions for the matrix, along with suitably dimensioned vectors, are possible and fall within the contemplated scope of the invention.

Figure 2:
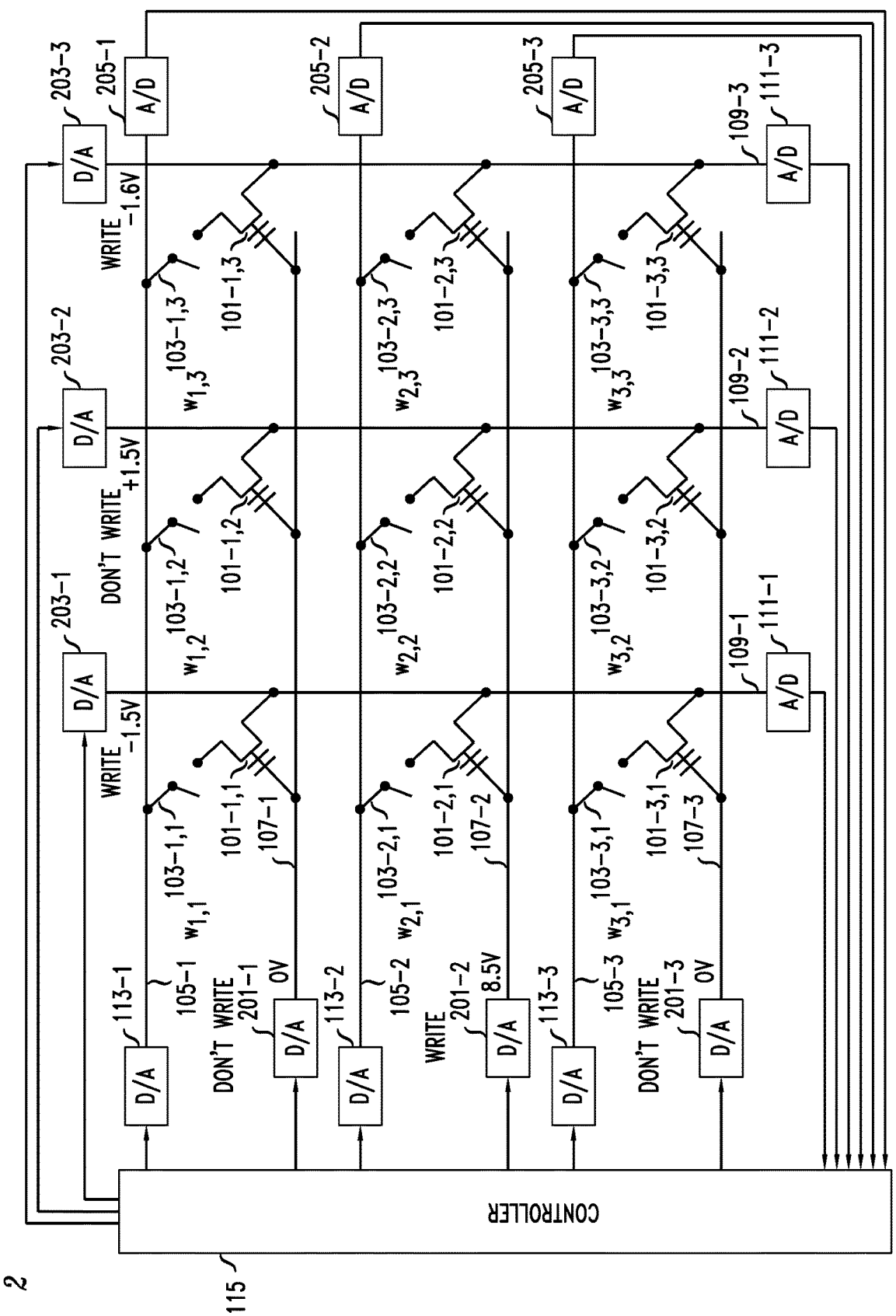
FIG. 2 shows the same arrangement of three-terminal memory cells as shown in FIG. 1 for representing the values of the matrix but configured so as to enable programming of the values of more than one of the elements of the matrix in parallel in accordance with the principles of the invention.

FIG. 2 shows the same arrangement of three-terminal memory cells 101 for representing the values of matrix W as is shown in FIG. 1, but configured so as to enable the parallel programming of more than one of the matrix elements, in accordance with the principles of the invention. To this end, additional elements not shown in FIG. 1 are shown in FIG. 2.

As shown in FIG. 2, all of switches 103 are placed in the open position. A positive or negative charge is supplied by applying a voltage difference, typically in the form of a pulse, between the gate and the drain of a cell in order to change the physical state of the cell. In this regard, note that an increase or decrease in resistance is determined by whether the pulse voltage is positive or negative. For floating gate cells, positive voltage pulses may be considered "program" pulses in that they cause charge to be added, whereas negative voltage pulses may be considered "erase" pulses in that they cause charge to be removed. The pulse width and absolute value of the voltage determine how much charge is added or removed.

Note, however, only those cells that see a sufficient magnitude of voltage applied between gate and drain are able to receive and store charge. In other words, to change the charge in the gate of a given cell, the absolute value of the voltage applied between the gate and drain must be above a threshold. In the example shown in FIG. 2, devices selected for writing see at least a full 10V from gate to drain, whereas those devices that are not to be written see a maximum of 7V from gate to drain. The cells that see such a full 10V from gate to drain are 101-2,1 and 101-2,3. Note that cell 101-2,2 sees a difference of only 7V, and so it is not written. The other cells see a difference of less than 1.6V.

Figure 3:
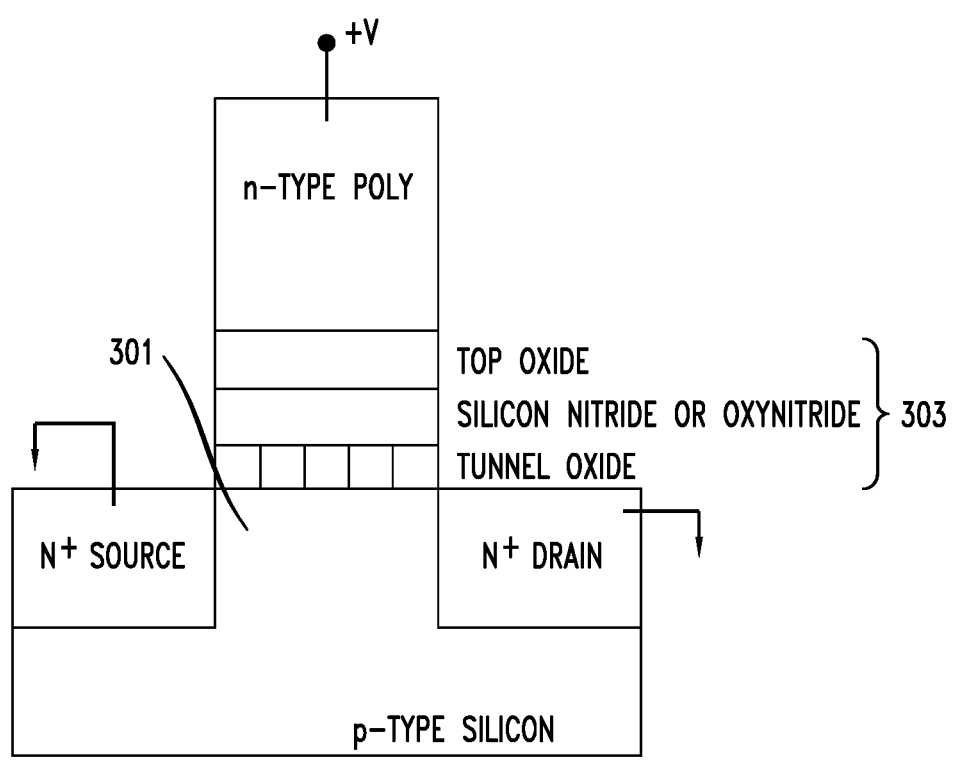
FIG. 3 shows a SONOS device suitable for use as the cells of FIG. 1.

A SONOS device, suitable for implementing cells 101, is shown in FIG. 3. The length of channel 301 of the device may be 1.2 μm and the width of channel 301 may be 7 μm. The oxide-nitride-oxide films (ONO) 303 layer may be grown in a tunnel oxidation furnace (VTR-20) in a dilute nitrous oxide ($N_2O$) atmosphere at 750° C.

For example, if each cell 101 is implemented by a SONOS device, such as shown in FIG. 3, negative voltage pulses, e.g., −11V pulses, can be used to remove charge, while positive voltage pulses, e.g., 10V pulses, can be used to add charge. It should be noted that the final value of charge stored in any cell reflects not only the charge that was added and deleted, but also the charge that was initially in the cell. Any of various pulse durations (i.e., pulse widths) may be employed, depending on factors such as cell structure, the degree of precision that is desired, and the voltage that is used. We have employed pulse widths from 10 microseconds to 2.5 milliseconds.

In cases where the cells are implemented by symmetric devices, as may be the case in the example above, the above-described roles of the drain and source may be reversed.

The write threshold is the threshold voltage above which a change in the physical state of a cell, e.g., a change in the charge stored therein, will take place. The write threshold may be determined by experimentation, as it is device-dependent. To that end, one may start with a voltage with a low absolute value and increase the absolute value of the voltage until it is determined that writing has taken place. This should be done for both positive and negative voltage to determine the respective thresholds for adding charge and for removing charge.

The higher the absolute value of the voltage is above the pertinent threshold, the faster the charge will be accumulated or removed, i.e., the faster the device will be written. Voltages having an absolute value below the pertinent thresholds are considered to effectuate substantially no change to the stored charge, even though there may be some small accumulation of charge due to current leakage. Current leakage is generally de minimis and irrelevant, but we mention it here for completeness.

It may be possible to add charge to at least one cell while at the same time removing charge from another, depending on which cells are to have their charge changed. However, at least two write steps are typically needed when charge is to be added to some cells of the array and removed from others.

In one write step, one or more cells may be pulsed to add charge, while one or more other cells may be pulsed with substantially no change in their charge state. In a second write step, one or more cells may be pulsed to remove charge, while, again, one or more other cells may be pulsed with substantially no change in their charge state.

The adding or removing of charge to any particular cell is under the control of controller 115, which controls the overall process of setting the values of the array. To this end, in the embodiment shown in FIG. 2, controller 115 specifies in digital form the voltages and pulse lengths to be supplied to the gates of each cell by each of D/A converters 201-1 through D/A 201-3, collectively D/A converters 201. Similarly, controller 115 specifies in digital form the voltages and pulse lengths to be supplied to the drain of each cell by each of D/A converters 203-1 through D/A 203-3, collectively D/A converters 203.

When adding charge to, or removing charge from, a cell, it may be advantageous to have foreknowledge of the initial charge state of the cell. To initialize with a known charge state, an initial state of zero charge may be set by first pulsing each cell sufficiently, e.g., with pulses of negative voltage having an absolute value greater than the charge removal threshold, to remove all charge therefrom. The complete removal of the charge can then be verified.

In an exemplary embodiment of charge removal, each cell of the array is being pulsed simultaneously for a first time period, using the maximum negative voltage between each gate and drain that can possibly be supplied by each of D/A converters 201 and each of D/A converters 203. The total amount of charge remaining in a row of cells may then be read by multiplying the array by a vector having a single numeric "1" in the location corresponding to the row to be read. Of course, all of the rows may be read simultaneously by employing a unitary vector, i.e., a vector whose elements all have unit value. If the value read on each column is not zero, this indicates that at least one of the cells in the column has more than zero charge, in which case the process may be repeated until all of the read results indicate that there is no charge remaining in any cell.

Alternatively, given that:
the current on output line 109-1 represents $X_1W_{1,1}+X_2W_{2,1}+X_3W_{3,1}$,
the current on output line 109-2 represents $X_1W_{1,2}+X_2W_{2,2}+X_3W_{3,2}$, and
the current on output line 109-3 represents $X_1W_{1,3}+X_2W_{2,3}+X_3W_{3,3}$, the current on output line 109-1 under the condition that $X_1=1$ and $X_2=X_3=0$ will represent the value of $W_{1,1}$.

Similarly, the current on output line 109-1 under the condition that $X_2=1$ and $X_1=X_3=0$ will represent the value of $W_{2,1}$. Likewise, the current on output line 109-1 under the condition that $X_3=1$ and $X_1=X_2=0$ will represent the value of $W_{3,1}$. The foregoing applies similarly for the other columns of matrix W and the resulting currents on output lines 109-2 and 109-3 Thus, the amount of charge in each cell may be individually verified.

Once the array is initialized by clearing all charge from all of the cells, values may be written to the cells by using pulses to store charge therein. In one embodiment, this may be achieved by pulsing each cell to first write the smallest value of the array that is to be written, so that all of the cells add that amount of charge. Next, additional charge is added to selected cells.

The cells selected for additional charge are those cells that are still below their specified values because the previous write step did not raise them all the way to their specified values. The amount of charge to be added is the amount needed to raise the smallest currently stored value of those cells that are still below their specified values to the next smallest one of the specified values. This corresponds to the difference between the value that was already written to each cell during the previous addition of charge and the next smallest value. While this is done, those cells that are already at their proper values are not written to.

The process then continues by adding additional charge to all those cells that are still below their specified values because the previous write step did not raise them all the way to their specified values. Again, the amount of charge to be added is the amount needed to raise the smallest currently stored value of those cells that are still below their specified values to the next smallest one of the specified values. This corresponds to the difference between the value that was already written to each cell during the previous addition of charge and the next smallest value. The foregoing method advantageously accelerates the programming of the array relative to a procedure in which each cell is written individually.

Note that the amount of charge corresponding to any value to be represented thereby is at the discretion of the implementer, as the correspondence depends, in part, on the particular device employed to implement the cells. How to select appropriate representations are well known to those of ordinary skill in the art.

As an example, suppose matrix W has a first row of elements that all have a value of 5, a second row of elements that all have a value of 10, and a third row of elements that all have a value of 15. After initializing the array so that no charge is stored in any of the cells, i.e., all the cells start with a value of zero, all of the cells are pulsed with positive voltage pulses to bring their charge up to correspond to a value of 5. Thereafter, only cells in the second and third row are pulsed to with additional positive pulses to add to them the equivalent charge corresponding to a value of 5 so as to bring their value up to 10. The first row is not pulsed so that its value does not change and remains at 5. Thereafter, only cells in the third row are pulsed with additional positive pulses to add to them the equivalent charge corresponding to a value of 5 so as to bring their value up to 15. As a result, all of the elements have the correct, specified values.

An alternate method to program initial values is to program a single row at a time. A single row may be activated at a time using a selected one of D/A converters 201. Each of D/A converters 203 would be configured to program the appropriate values into each device on the row coupled to the selected one of D/A converters 201. As an example, in FIG. 2, D/A converter 201-2 is selected and supplies at its output 8.5V, thus activating the row of charging line 107-2. D/A converter 203-1 and D/A converter 203-3 apply −1.5V and −1.6V, respectively, resulting in different amounts of charge being added to cells 101-2,1 and 101-2,3. D/A converter 203-2 applies+1.5V resulting in no change in the charge of cell 101-2,2.

Once all of the cells are written with the appropriate values, i.e., the correct amount of charge, the multiplication may be performed as described hereinabove. To this end, switches 103 are closed and values for the vector elements are supplied by D/A converters 113. The results are supplied to controller 115 via A/D converters 111.

If the arrangement is to be used next to perform multiplication of a new matrix that differs at the position of at least one element from the prior matrix that was multiplied, the cell at any such position must have its charge updated to reflect the new value. Thus, controller 115 must cause charge to be added or removed from any cell that needs to be updated. The process is facilitated by the fact that the multiplication operation preserves the charge stored in each cell, hence controller 115 knows the charge in each cell that corresponds to the prior value of the matrix element that it represented. Therefore, only the difference between the value of the charge already in a cell (i.e., for the prior matrix) and the value of the charge that needs to be in that cell to represent the new matrix element needs to be added or removed from that cell. The same is true for all of the cells.

An example process for making the updates described above resembles the process we have described for setting the array to its initial values, except that we no longer assume that there is no charge in each cell; instead, the charge known to be in each cell is taken into account.

Thus, for each cell that must have charge added, all such cells are first pulsed to add charge corresponding to the smallest amount of charge that needs to be added to any cell. This is determined by the difference between the new value of each element and the old value thereof. Once all of the cells that are having charge added to them are brought up by the minimum difference between the new value of each element and the old value thereof, those cells that are now at the correct value are no longer pulsed. Thereafter, each cell that still requires additional charge because it is not at its desired value is pulsed to add charge corresponding to the smallest amount of charge that needs to be added to any cell to bring it up to new value. Once all the cells are brought up by this amount of charge, those cells that are now at the correct value are no longer pulsed. Thereafter, each cell that still requires additional charge because it is not at its desired value is again pulsed to add charge corresponding to the smallest amount of charge that needs to be added to any cell to bring it up to its new value, and the process is repeated.

As an example, suppose array W had, as in an example given above, a first row of elements all with the value 5, a second row of elements all with the value 10, and a third row of elements all with the value 15. Suppose we desire to change the array to new values wherein the elements of the first row are all 15, the elements of the second row are all 25, and the elements of the third row are all 10.

To update the array in the manner described above, we first pulse the first and second rows with positive voltage pulses to add charge corresponding to 10, so that the cells of the first row become charged to 15 while the cells of the second row become charged to 20. The third row is kept below the threshold so that charge is not added to it. (Charge will, in fact, need to be removed from the third row.)

Next, the cells of the first and third rows are kept below the threshold so that their charges remain unchanged, while the second row is pulsed with positive voltage pulses to add charge corresponding to 5, so that each of the elements of the second row becomes charged to 25.

Now for each cell that must have charge removed, all such cells are first pulsed to remove charge corresponding to the smallest amount of charge that needs to be removed from any cell. This is determined by the difference between the new value of each element and the old value thereof. Once all of the cells that are having charge removed from them are reduced in charge by the minimum difference between the new value of each element and the old value thereof, those cells that are now at the correct value are no longer pulsed.

Thereafter, each cell that still needs to be discharged down to its desired value is pulsed to remove charge corresponding to the smallest amount of charge that needs to be removed from any cell to bring it down to its new value. Once all the cells are brought down by this amount of charge, those cells that are now at the correct value are no longer pulsed. Thereafter, each cell that still needs to be discharged down to its desired value is again pulsed to remove charge corresponding to the smallest amount of charge that needs to be removed from any cell to bring it up to its new value, and the process is repeated.

Continuing with the example above, the first and second rows are kept below the threshold so that their charge remains unchanged while the third row is pulsed with negative voltage pulses to remove charge corresponding to 5, so that each of the elements of the third row becomes charged with 10.

In another embodiment, depending on which cells need to have their charge changed and in which direction, it is possible that some of the cells are pulsed to add charge while at the same time other cells are pulsed to remove charge.

Note, that although many combinations of cells can be written at the same time, not every combination of cells can be specified to be written at the same time. Hence, it may be advantageous to pulse some cells to add charge while other cells are also having charge added thereto and thereafter pulse some of those cells to remove some or all of the added charge. The same is true for first removing charge and then replacing charge in some cells.

Also note that the voltages may be independently supplied by each of D/A converters 201 and D/A converters 203. Hence, some cells may be targeted with a higher voltage difference while at the same time other cells are targeted with a lower voltage difference. Thus, not only can different ones of cells 101 be written simultaneously with the same values as in the example above, but even more advantageously, it may be possible to simultaneously write different values to different ones of cells 101.

In another embodiment of the invention, to initialize the array one could cycle the array between pulsing to achieve charge removal such that all charge is removed and pulsing to store maximum charge in the cells of the array so as to achieve a known state for each cell.

In some cases, the matrix W may be updated efficiently by using the outer product of two vectors. For example, the outer product of a row vector and a column vector of three dimensions each is a matrix of nine elements, each of which can specify an amount of charge to add or remove from a corresponding element of matrix W. Thus, the updates to the nine elements of matrix W may be specified by the six values that determine the two vectors.

As noted hereinabove, implementations of the invention may be particularly advantageous in connection with neural networks. A common neural network learning scheme uses backpropagation of errors, which updates each layer during each epoch using a delta learning rule. The weights are stored in a matrix W. Mathematically, updating the matrix W requires an incremental update to all of the weight elements, $W_{ij}$. The updates to every element $W_{ij}$ make up a matrix denoted herein as $\Delta W$, with the same number of rows and columns as matrix W has.

The matrix $\Delta W$ may be determined from the multiplication of vectors a and b, e.g., the outer product of a ⊗ b, where a is a column vector with a number of rows equal to the number of rows of matrix W, and b is a row vector with a number of columns equal to the number of columns of matrix W. The update matrix $\Delta W$ may thus be given by $\Delta W = a \otimes b$. As part of the neural network training process, the updated weight matrix $W_F$ will overwrite the original matrix W. Hence, $W_F = \Delta W + W$.

Using the arrangement shown in FIG. 2, the charge in the matrix elements 101 may be updated from representing W to representing $W_F$ in the corresponding memory elements, where the matrix elements are represented by the respective conductances of cells 101. This requires vectors a and b, which are determined by a digital processor, which may be controller 115 or some other processor (not shown) coupled to controller 115, to be converted to electronic temporal or voltage signals that are used to represent the numerical values of their elements. These signals are then applied using D/A converters 201 and 203.

In an illustrative implementation, column vector a is converted to a constant-voltage temporal pulse train using D/A converters 201, represented as $V_{row,1}$, which is applied on the respective rows coupled to the gates of cells 101. For example, the constant-voltage temporal pulse train corresponding to the first element of vector a is applied by D/A converter 201-1, the constant-voltage temporal pulse train corresponding to the second element of vector a is applied by D/A converter 201-2, and the constant-voltage temporal pulse train corresponding to the third element of vector a is applied by D/A converter 201-3.

The temporal pulse train can take any of several alternative forms. For example: In some embodiments it can be a single variable-length pulse. In other embodiments, it can be implemented in multiple identical pulses. In still other embodiments, it can be implemented in multiple pulses of different lengths, wherein each respective pulse has a length corresponding to a particular bit in the numerical quantity that constitutes the digital input.

Meanwhile, each of the elements of column vector b is converted to a voltage $V_{column,j}$ using ones of D/A converters 203, such that the change in conductance of elements 101 of each column j is proportional to the value of element h.

In an example, each $V_{column,j}$ (j=1, 2, . . . up to the total number of columns) is applied to its respective column j as a single fixed-length pulse. The particular voltage value that $V_{column,j}$ takes for the jth column is specified by the jth element of column vector b, i.e., by the value of element $b_j$.

In example embodiments, the single fixed-length pulse spans the entire duration of the temporal pulse train. Thus, the device will write during any of the non-zero pulses being applied to each row, and the magnitude of the write will depend on the value of $V_{column,j}$. (Alternatively, in embodiments wherein the temporal pulse train is constituted by multiple pulses of different lengths corresponding to respective bits of the digital input, $V_{column,j}$ can vary in accordance with each respective pulse number along the row.)

This operation will update the charges stored in the respective floating gate elements of the matrix to values proportional to the respective elements of $W_F = \Delta W + W$. Following this parallel update operation, the resulting updated matrix $W_F$ can be used as a new version of matrix W for further operations relevant to neural algorithms such as vector-matrix multiplication (VMM) and matrix-vector multiplication (MVM).

In some embodiments, the charge increment added to or removed from the floating gate element will be exponential in the applied voltage and linear in the time duration over which it is applied. Under that assumption, element h would be designed to be proportional to the logarithm of an effective write voltage; i.e., proportional to $\log(V_{column,j} - V_{row,i} - V_{threshold})$, where $V_{threshold}$ is a threshold below which the cells do not write, i.e., where no charge is added or removed as described hereinabove. Thus, the value of element $b_j$ depends on the device threshold as well as on the voltage placed on the rows by D/A converters 201 and the voltage placed on the columns by D/A converters 203.

Note in this regard that although not required, it will be typical for the adding and removing of charge to be performed in separate operations. Thus, the above is performed at least twice for each update operation, once to add charge to various cells and once to remove charge from various cells. Thus, there will be a version of vectors a and b for charge addition, and a separate version for charge removal.

In some embodiments, four operations are used to cover all possible values of vectors a and b. Adding charge is done in two steps. First, charge is added for values of a that are positive and are multiplied by values of b that are positive. Second, charge is added for values of a that are negative and are multiplied by values of b that are negative. Similarly, removing charge is done in two steps. First, charge is removed for values of a that are positive and are multiplied by values of b that are negative. Second, charge is removed for values of a that are negative and are multiplied by values of b that are positive.

As described previously, vector matrix multiplication can be performed by using D/A converters 113 and A/D converters 111. Additionally, matrix vector multiplication may be performed through the use of A/D converters 205-1 through 205-3, herein collectively A/D converters 205 and D/A converters 203-1 through 203-3, collectively D/A converters 203.

To that end, the elements of matrix W are multiplied by the elements of a column vector C whose elements are supplied by D/A converters 203, where in this case D/A converter 203-1 corresponds to the uppermost element of the column vector and D/A converter 203-3 corresponds to the lowest element of the column vector, and the results are read by A/D converters 205. As a result, the current supplied to A/D converter 205-1 represents $W_{1,1}C_1 + W_{1,2}C_2 + W_{1,3}C_3$, the current supplied to A/D converter 205-2 represents $W_{1,2}C_1 + W_{2,2}C_2 + W_{2,3}C_3$, and the current supplied to A/D converter 205-3 represents $W_{1,3}C_1 + W_{3,2}C_2 + W_{3,3}C_3$. These resulting digitized values then may be used in further processing and/or stored. For example, they may be supplied to controller 115 for further processing and/or storage.

When such matrix-vector multiplication is performed, D/A converters 113 are each placed in a disabled state to prevent any signal that would influence the values detected by A/D 205. Similarly, when vector-matrix multiplication is performed, D/A converters 203 are each placed in a disabled state to prevent any signal that would influence the values detected by A/D converters 111. D/A converters 201 provide a fixed read voltage $V_{g,read}$ in both cases. In an alternative embodiment, in lieu of disabling the various A/D converters, switches may be employed to disconnect them from supplying any signal. Such switches could be under the control of controller 115.

A/D converters 111 and A/D converters 205 may be physically implemented as the same converters. If so, they are switched between rows and columns using switching circuitry, not shown, depending on whether a matrix vector multiplication or a vector matrix multiplication is being performed, respectively.

Similarly, D/A converters 113 and 201 may be physically implemented as the same converters. If so, they are switched between rows and columns using switching circuitry, not shown, depending on whether a vector matrix multiplication or a matrix vector multiplication is being performed, respectively.

A resistor (not shown) may be added in series to each of switches 103 to limit the maximum current through cells 101. Limiting the maximum current allows for larger arrays by reducing the current on each wire.

In an alternate embodiment, to perform the multiplication, elements $X_1$, $X_2$, $X_3$, of vector X are represented as respective voltage pulses on gate charging lines 107. The voltage pulses will be of constant voltage and of different duration. The voltage pulses will activate memory cells 101, allowing current to flow for the duration of the voltage pulses. A fixed read voltage will be applied to input lines 105.

What is claimed is:

1. A method for changing effective resistances of cells in an array of three-terminal memory cells, wherein:
   (a) each of the cells has a gate, a first terminal, and a second terminal;
   (b) the cells are arranged into at least three rows and at least three columns so that each of the cells corresponds to and represents a value of a respective element of the array;
   (c) each respective element value of the array is represented by an effective resistance from the first terminal to the second terminal of its corresponding one of the cells,
   (d) each of the effective resistances depends on a physical state of the cell;

(e) the respective element values of the array collectively constitute a state matrix of the array;

(f) in operation, the gates of the cells in each row are coupled together for receiving a row programming signal;

(g) in operation, the first terminals of the cells in each column are coupled together for receiving a column programming signal;

(h) the method comprises:
   determining a desired value for the state matrix of the array; and
   applying at least one matrix-write operation to program the array with the desired state matrix value;

(i) each matrix-write operation comprises:
   applying respective row programming signals in parallel to at least some of the rows; and
   while applying the row programming signals, also applying respective column programming signals in parallel to at least some of the columns; and (j) at least one matrix-write operation supplies a suprathreshold voltage, greater in absolute value than a programming threshold, across the gate and first terminal of each of at least two of the cells at the same time, so as to change the physical states of at least two cells substantially simultaneously.

2. The method of claim 1, wherein:
the at least one matrix-write operation supplies a subthreshold voltage across the gate and first terminal of at least one additional one of the cells;
the subthreshold voltage has an absolute value less than a threshold;
the supplying of the subthreshold voltage is performed substantially simultaneously with the supplying of the suprathreshold voltage; and
the supplying of the subthreshold voltage is performed such that the physical state of the at least one additional cell remains substantially the same.

3. The method of claim 1, wherein the physical state of at least one of the cells corresponds to an amount of charge stored in the at least one of the cells.

4. The method of claim 1, wherein the row and column programming signals are supplied in the form of voltage pulses.

5. The method of claim 1, wherein:
the row programming signals and/or the column programming signals are supplied in the form of pulses having pulse lengths; and
the pulses supplied, respectively, to a first and to a second of at least two cells have different pulse lengths.

6. The method of claim 1, wherein the array represents a matrix, and the method further comprises using the three-terminal memory cells to multiply the matrix by a vector.

7. The method of claim 6, wherein the vector has a plurality of elements, and values of the vector elements are supplied to the cells as voltages applied to respective first terminals of the cells.

8. The method of claim 1, further comprising disconnecting the second terminals of all the cells at least during a time during which a suprathreshold voltage is being supplied in at least one matrix-write operation.

9. The method of claim 1, wherein, in at least one matrix-write operation, electric current to the cells is limited by a resistor coupled in series to at least the first or second terminal of each of the cells.

10. The method of claim 1, wherein:
the step of determining a desired value for the state matrix of the array comprises targeting at least two cells of the plurality as cells-to-be-written; and
the step of applying at least one matrix-write operation comprises changing the physical states of the targeted cells substantially simultaneously by the application of a voltage between the gate and the first terminal of each of the targeted cells.

11. The method of claim 10, wherein during the changing of the physical states of the targeted cells, the physical states of any non-targeted cells are maintained as unchanged.

12. The method of claim 1, wherein the array is part of a neural network.

13. The method of claim 1, wherein at least one matrix-write operation comprises:
supplying a first suprathreshold voltage having an absolute value greater than a first threshold between the respective gates and first terminals of a first set of one or more of the cells so as to change the physical states of the cells of the first set; and
supplying a second suprathreshold voltage having an absolute value greater than a second threshold between the respective gates and first terminals of a second set of one or more of the cells so as to change the physical states of the cells of the second set; wherein:
the first suprathreshold voltage is a positive voltage and the second suprathreshold voltage is a negative voltage; and
the first and second suprathreshold voltages are supplied so as to change the physical states of the first set of cells substantially simultaneously with the physical states of the second set of cells.

14. The method of claim 13, further comprising supplying a third voltage between the gate and drain of at least one further cell that belongs neither to the first nor to the second set, wherein:
the third voltage is supplied substantially simultaneously with the first and second voltages; and
the third voltage has a value such that the physical state of any cell to which it is applied remains substantially unchanged.

15. The method of claim 1, comprising applying a sequence of two or more matrix-write operations to program the array with the desired state matrix value.

16. The method of claim 15, wherein:
each matrix write operation in the sequence changes the physical state or states of a targeted subset of the cells in the array; and
the desired state matrix value is achieved as the cumulative result of all of the matrix-write operations in the sequence.

17. The method of claim 16, wherein each matrix write operation in the sequence produces an equal change in the physical states of all of the cells in the targeted subset.

18. The method of claim 17, wherein each matrix write operation in the sequence produces the least change in physical state that is required to bring at least one cell of the targeted subset to its desired value in the state matrix.

19. The method of claim 1, wherein, in at least one matrix write operation, both the row programming signal and the column programming signal specify, in part, desired changes in the physical states of targeted cells.

20. The method of claim 1, wherein the changes in the physical states of the cells are produced in response to total durations of applied voltage pulses.

* * * * *